(12) United States Patent
Funato et al.

(10) Patent No.: US 9,991,815 B2
(45) Date of Patent: Jun. 5, 2018

(54) POWER CONVERSION APPARATUS

(71) Applicant: HITACHI, LTD., Chiyoda-ku, Tokyo (JP)

(72) Inventors: Hiroki Funato, Tokyo (JP); Masayoshi Takahashi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days. days.

(21) Appl. No.: 15/315,658

(22) PCT Filed: Jun. 26, 2015

(86) PCT No.: PCT/JP2015/068558
§ 371 (c)(1),
(2) Date: Dec. 1, 2016

(87) PCT Pub. No.: WO2016/208074
PCT Pub. Date: Dec. 29, 2016

(65) Prior Publication Data
US 2017/0187299 A1    Jun. 29, 2017

(51) Int. Cl.
*H02M 7/00* (2006.01)
*H02M 7/44* (2006.01)
*H02G 5/02* (2006.01)
*H02M 7/04* (2006.01)

(52) U.S. Cl.
CPC ............... *H02M 7/003* (2013.01); *H02G 5/02* (2013.01); *H02M 7/04* (2013.01); *H02M 7/44* (2013.01)

(58) Field of Classification Search
CPC ........... H02M 7/003; H02M 7/04; H02M 7/44
See application file for complete search history.

(56) References Cited

U.S. PATENT DOCUMENTS

| | | | | |
|---|---|---|---|---|
| 6,629,854 B2* | 10/2003 | Murakami | ............... | H02B 1/20 439/212 |
| 7,154,360 B2* | 12/2006 | Wada | ................. | H03H 9/02779 310/313 C |
| 7,961,472 B2* | 6/2011 | Tokuyama | ............ | H02M 7/003 257/706 |
| 9,610,847 B2* | 4/2017 | Shin | ....................... | H02M 7/003 |
| 2009/0002099 A1* | 1/2009 | Kajihara | ............ | H03H 9/02921 333/193 |
| 2011/0064871 A1 | 3/2011 | Uchida et al. | | |
| 2011/0228508 A1* | 9/2011 | Inuduka | ................ | H02M 7/003 361/811 |

(Continued)

FOREIGN PATENT DOCUMENTS

JP    2011-124503 A    6/2011
JP    2013-232613 A    11/2013

(Continued)

*Primary Examiner* — William H Mayo, III
*Assistant Examiner* — Hiram E Gonzalez
(74) *Attorney, Agent, or Firm* — Miles & Stockbridge P.C.

(57) ABSTRACT

A power conversion apparatus is provided with a bus bar connecting a cable connected to an external power supply or load and an internal circuit. To provide this power conversion apparatus with a wiring structure for noise propagation suppression without use of a filter circuit element that causes increase in the volume of the apparatus, the bus bar is provided with an electromagnetic band gap structure. Electromagnetic noise is thereby suppressed from propagating from the power conversion apparatus to the power supply or the load via the cable.

15 Claims, 5 Drawing Sheets

(56) References Cited

U.S. PATENT DOCUMENTS

| | | |
|---|---|---|
| 2013/0265736 A1 | 10/2013 | Rokuhara |
| 2013/0322144 A1 | 12/2013 | Funato et al. |
| 2014/0029227 A1 | 1/2014 | Sasaki et al. |
| 2015/0054713 A1 | 2/2015 | Takasaki |

FOREIGN PATENT DOCUMENTS

| | | |
|---|---|---|
| JP | 2014-27180 A | 2/2014 |
| JP | 2015-41876 A | 3/2015 |
| WO | WO 2012/117694 A1 | 9/2012 |

* cited by examiner

POWER CONVERSION APPARATUS

TECHNICAL FIELD

The present invention relates to a power conversion apparatus.

BACKGROUND ART

One of the background arts in the present technical field is that disclosed in Japanese Patent Laid-open No. 2011-124503 (Patent Literature 1). This document describes that an electromagnetic noise in a high frequency band is suppressed from being radiated from a space between the back of a wiring board and the internal surface of a housing.

Japanese Patent Laid-Open No. 2014-27180 (Patent Literature 2) describes that a circuit board which makes it possible to achieve both size reduction and suppression of malfunctions due to mutual interference between elements, noise, or the like is provided.

CITATION LIST

Patent Literature

PTL 1: Japanese Patent Laid-Open No. 2011-124503
PTL 2: Japanese Patent Laid-Open No. 2014-27180

SUMMARY OF INVENTION

Technical Problem

To ship power conversion apparatuses (inverters, converters) to the market, it is required to reduce electromagnetic noise to make them compliant with the EMC (Electromagnetic Compatibility) standards. To reduce electromagnetic noise, it is in common use to add a filter circuit element such as a capacitor to a power supply line or an output line. However, addition of a filter circuit element poses a problem of an increased volume of equipment. Patent Literature 1 and 2 describe techniques of periodically disposing conductors without use of a filter circuit element to prevent propagation of noise. However, the methods in these prior arts are for preventing propagation of electromagnetic noise, produced by an integrated circuit in a printed board, within the printed board; but the methods are inapplicable to equipment, such as a power conversion apparatus, in which a printed board is not used for a high-voltage, high-current system.

Accordingly, the present invention provides a power conversion apparatus with a wiring structure that suppresses noise propagation without use of a filter circuit element leading to increase in the volume of equipment.

Solution to Problem

To solve the above problem, the present invention takes the following measure in a power conversion apparatus with a bus bar connecting a cable connected to an external power supply or load and an internal circuit: the bus bar is provided with an electromagnetic band gap structure, thereby suppressing electromagnetic noise propagated from the power conversion apparatus to the power supply or load via the cable.

To solve the above problem, the present invention further takes the following measure in a power conversion apparatus in which a cable connected to an external power supply or load and an internal circuit connected with each other through a bus bar formed by arranging a positive plate and a negative plate in parallel: a pair of conductive plates connected to either the positive plate or the negative plate is placed between the positive plate and negative plate constituting the bus bar such that parts of the pair of the conductive plates are in parallel to but not in contact with each other.

Advantageous Effects of Invention

According to one of aspect of the present invention can provide a power conversion apparatus in which an electromagnetic noise reduction effect is obtained without use of a filter circuit element.

Other problems, configurations, and effects than described above will be apparent from the following description of embodiments.

DESCRIPTION OF EMBODIMENTS

The present invention provides a power conversion apparatus in which propagation of electromagnetic noise is suppressed by providing a high-voltage bus bar wiring with a conductor periodical structure (Electromagnetic Band Gap structure) for noise reduction.

Specifically, the present invention provides a power conversion apparatus in which noise is reduced by providing a bus bar connecting a circuit of the power conversion apparatus, such as an inverter or a converter, with a conductor periodical structure (Electromagnetic Band Gap structure) as a noise suppression structure.

Hereafter, a description will be given to embodiments of the present invention with reference to the drawings.

Example 1

Figure 1:
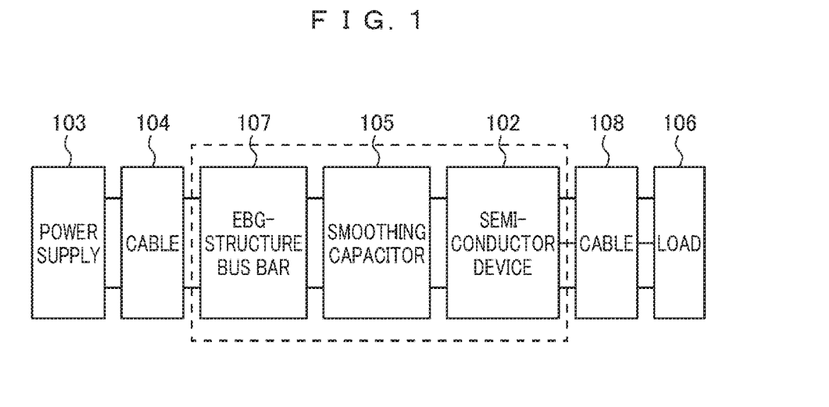
FIG. 1 is a block diagram illustrating a configuration of a power conversion apparatus in a first example of the present invention.

FIG. 1 illustrates a configuration of a power conversion apparatus 101 in a first example of the present invention. Here, an inverter that generates alternating-current voltage from direct-current voltage will be taken as an example. The inverter 101 generates a desired voltage or current by switching (switching between turn-on and turn-off of) a semiconductor device 102, such as IGBT, MOSFET, or SiC. For power supply 103, a battery or a power supply obtained by converting an alternating-current power supply into a direct-current voltage with a converter is used. For example, an inverter for driving a hybrid vehicle uses a high-voltage battery of several hundreds of volts as the power supply 103. For example, medical equipment such as an X-ray diagnostic apparatus utilizes commercial alternating-current power supply; therefore, a rectifying circuit or a converter is used for conversion to direct-current power supply. The power supply 103 and the inverter 101 are connected with each other through a cable 104. Using a shielded cable for the cable 104 allows leakage of electromagnetic noise from the cable 104 to be suppressed. During switching, the semiconductor device 102 produces a switching current and voltage of a high frequency; therefore, a smoothing capacitor 105 is generally used to cope with this. An output of the inverter 101 is connected to a load 106 through a cable 108. For example, a load 106 of an inverter 101 for a hybrid vehicle is a motor, which is driven by generating and applying a three-phase current.

A description will be given to mechanisms of noise production and propagation. As mentioned above, electromagnetic noise is produced by switching of the semiconductor device 102. The produced electromagnetic noise is not completely smoothed by the smoothing capacitor 105 and leaked to the power supply 103 or the load 106 via a bus bar wiring. The thus produced electromagnetic noise becomes normal mode noise produced between a positive pole and a negative pole of a power supply wiring. There are also cases where the electromagnetic noise becomes noise with which a positive pole and a negative pole fluctuate in potential in an identical phase with respect to GND of the housing of the inverter 101 or the like. This noise is propagated as common mode noise between the wiring and GND.

A description will be given to the EMC regulations. The EMC regulations are intended to limit an amount of electromagnetic noise produced by devices and apparatuses for the stable operation of electronic equipment. In case of inverters for automobiles, for example, it should be verified that an amount of electromagnetic noise of each single unit is not more than a predetermined value in accordance with the international standards of CISPR25. Further, it should be verified that an amount of noise of each single unit is not more than a predetermined value as is incorporated into an automobile. The noise evaluation methods are roughly classified into those for radiation noise and those for conduction noise. In the methods for radiation noise, noise radiated from equipment into a space is measured with a testing antenna. In the methods for conduction noise, an LISN (Line Impedance Stabilization Network) or a current/voltage probe is used to measure an amount of electromagnetic noise produced in an equipment power supply line. With respect to conduction noise in vehicle-mounted equipment for passenger cars, the targets of regulation are only an amount of noise of a power supply line connected to a 12-V battery. However, it is scheduled that the CISPR standards will be revised in the near future and conduction noise from high-voltage wirings of vehicle-mounted equipment will also be included in the targets of regulation. That is, where electromagnetic noise produced by switching of a semiconductor device as mentioned above leaks to outside an inverter, it is required to control an amount of the noise to a prescribed value or below.

As described above, each power conversion apparatus is required that an amount of electromagnetic noise, produced by switching, leaking to outside the apparatus should not be more than a prescribed value.

The present invention is characterized in that a bus bar provided as a power input wiring of an inverter 101 as a power conversion apparatus is provided with a structure based on a principle of EBG (Electromagnetic Band Gap). In this structure, a noise suppression element, that is, an EBG-structure bus bar 107 is provided, thereby a low-noise power conversion apparatus being provided.

Figure 2A:
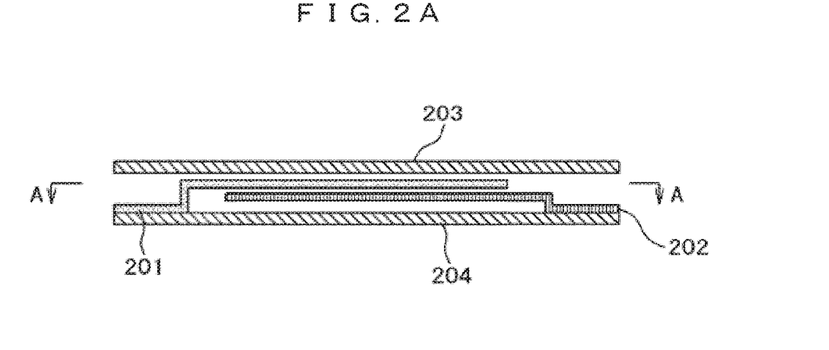
FIG. 2A is a front view of an EBG-structure bus bar in the first example of the present invention.
Figure 2B:
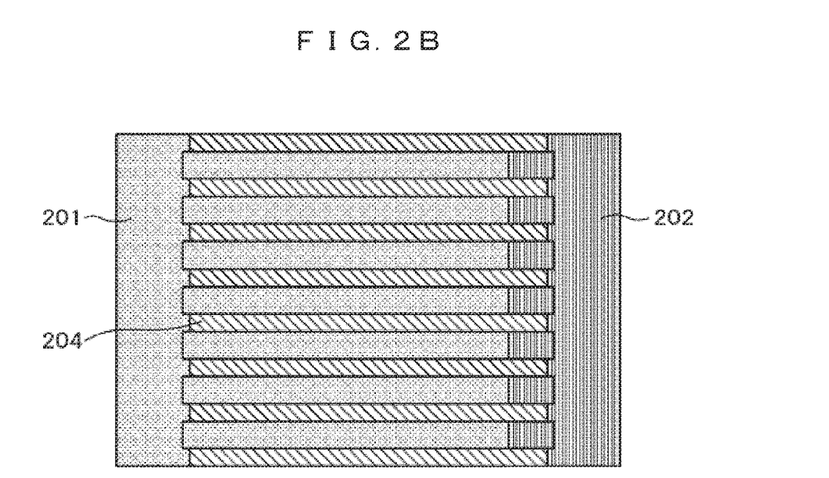
FIG. 2B is a view A-A of an EBG-structure bus bar in the first example of the present invention.

FIG. 2A and FIG. 2B illustrate details of an EBG-structure bus bar 107 of a power conversion apparatus in the first example of the present invention. The EBG-structure bus bar 107 is formed by shaping a metal plate. For the material, copper, aluminum, or the like high in electrical conductivity is used so as to reduce a loss at the EBG-structure bus bar 107. A plate thickness depends on an amount of current employed in the apparatus to which the material is applied and is typically several millimeters or so. When the bus bar is used for connection between a semiconductor device and a smoothing capacitor, a flat plate shape with a large width is adopted for the shape of the bus bar. The distance between a positive pole and a negative pole is set close to several millimeters or less for inductance reduction. A flat plate shape also brings about an advantage of good heat dissipation.

Conventional bus bar wirings are formed of two parallel flat plates opposed to each other. As illustrated in FIG. 2A, this example of the present invention is provided with a structure in which an EBG-structure bus bar configured of a noise propagation suppression element A 201 and a noise propagation suppression element B 202 is additionally provided. Thus noise propagation suppression elements 201 and 202 are members in such a shape (hereafter, referred to as L shape) that a joint surface is added to an L-shaped portion. These members are inversely opposed to each other and paired as a set; and one ends thereof are secured on the negative plate 204 and the L-shaped other ends are formed into a comb teeth shape. As illustrated in FIG. 2B, the portions formed into a comb teeth shape are disposed such that the portions vertically overlap with each other. The portions formed into a bomb teeth shape that are opposed surfaces in an L shape are prevented from being brought into physical contact with each other by inserting a laminate sheet (not shown) for electrical insulation in between. This brings about an advantage. Capacitance is formed by the L-shaped opposite surfaces of the noise propagation suppression element A 201 and the noise propagation suppression element B 202. Inductance is formed by a loop path through the negative plate 204. The high-frequency energy of electromagnetic noise is reduced by these noise propagation suppression elements 201 and 202 approximately at a frequency at which the capacitance and the inductance resonate with each other. As a result, a noise propagation suppression effect is achieved without use of a filter, such as a capacitor or a magnetic core, for high-frequency noise reduction.

The noise propagation suppression elements 201 and 202 are formed in an L-shaped comb shape so that the elements can be shaped by cutting and bending a metal flat plate. As a result, this configuration is also applicable to a high-voltage/high-current circuit that does not use a printed board. As mentioned above, this noise propagation suppression principle is referred to as EBG, high impedance surface, or the like. The noise propagation suppression elements and the positive plate 203 or negative plate 204 can be connected with each other by welding or the like. The width and length of the L shape of the noise propagation suppression element A 201 and the noise propagation suppression element B 202 are determined according to the frequency of noise desired to reduce. For example, when the width of the L shape of the noise propagation suppression element A 201 and the noise propagation suppression element B 202 is 12 mm, the length thereof is 180 mm and the gap therebetween is 0.1 mm, parasitic capacitance is calculated as 58 pF, inductance is calculated as 33 nH, and resonance frequency is approximately 110 MHz.

The noise propagation suppression elements 201 and 202 need not be shaped by bending. Instead of that, an alternative structure may be adopted. In this structure, metal flat plates are machined into a comb teeth shape and then the comb teeth shaped metal flat plates and the positive plate 203 or the negative plate 204 are connected by welding or the like in between a metal block having a thickness equivalent to the bending height in the above-mentioned bending.

Figure 3:
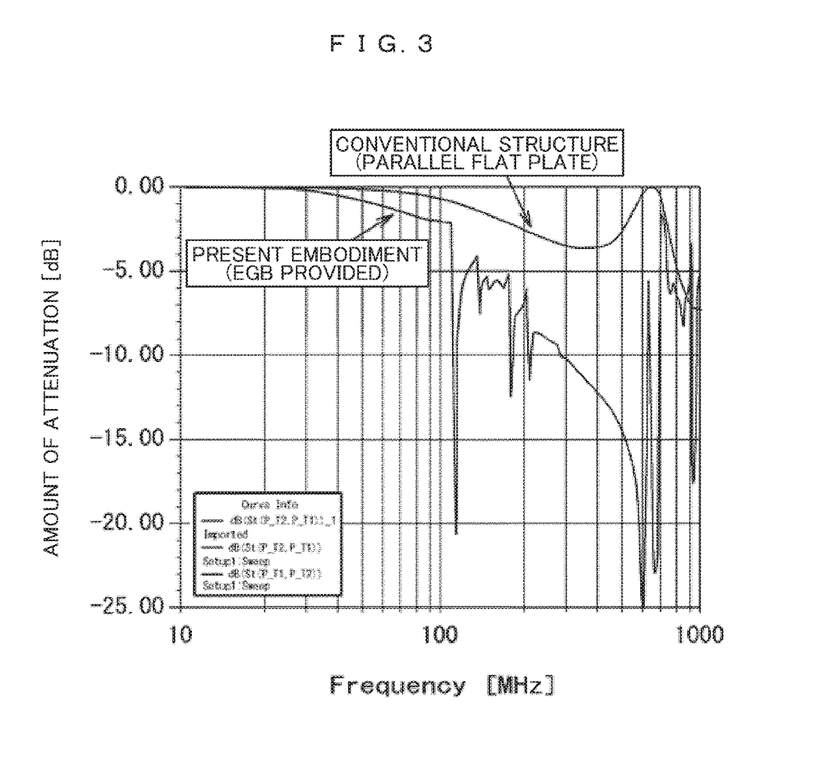
FIG. 3 is a graph indicating the noise reduction effect by an EBG-structure bus bar in the first example of the present invention.

FIG. 3 indicates a result of an electromagnetic field analysis for an EBG-structure bus bar for noise reduction in the first example. With respect to an EBG-structure bus bar formed of a noise propagation suppression element A 201 and a noise propagation suppression element B 202 formed into an L shape having the dimensions mentioned in relation to the above example, an amount of high frequency attenuation was confirmed by an analysis. The amount of high frequency attenuation indicates a noise reduction effect of the EBG-structure bus bar. The outer dimensions of the noise propagation suppression element A 201 and noise propagation suppression element B 202 constituting the EBG-structure bus bar were 90 mm in width and 150 mm in length; and the gap between the positive plate 203 and the negative plate 204 was 2 mm. For the purpose of comparison, the drawing also indicates a result obtained in a case where a noise suppression element such as an EBG-structure bus bar is not provided. As seen from the result of the analysis, when such an EBG-structure bus bar as in this example is used, a sharp peak occurs in proximity to 110 MHz and an amount of high frequency attenuation is larger as compared with the case where an EBG-structure bus bar is not used.

In the configuration of the EBG-structure bus bar formed of the noise propagation suppression element A 201 and the noise propagation suppression element B 202 illustrated in FIGS. 2A and 2B, the resonance frequency can be matched with a desired frequency. This is realized by adjusting the size and shape of the noise propagation suppression elements 201 and 202. In general, however, an outside shape and size of the wiring of the EBG-structure bus bar are determined in accordance with such conditions as the overall size, cost, and the like of the power conversion apparatus (inverter 101 in the case of this example). It is required to design the noise propagation suppression elements 201 and 202 so that these elements fall within the outside shape of the power conversion apparatus.

A power conversion apparatus is generally mounted with a ground capacitor for the purpose of noise reduction and safety. For high frequencies of several tens of MHz or above, however, the noise reduction effect of the ground capacitor is reduced by influence of parasitic inductance. Meanwhile, the noise propagation suppression structure of the EBG-structure bus bar equipped with the noise propagation suppression elements 201 and 202 in this example has an effect in high frequency bands of several tens of MHz or above. Further, the structure of the EBG-structure bus bar equipped with the noise propagation suppression elements 201 and 202 in this example can be designed even within a limited size.

According to the foregoing, the EBG-structure bus bar equipped with the noise propagation suppression elements 201 and 202 in this example brings such an effect that a power conversion apparatus, in which conduction noise of a power supply line is reduced, can be provided without using an additional filter circuit element.

When the inverter 101 as a power conversion apparatus is applied to a vehicle, the following structure can be taken in the configuration illustrated in FIG. 1: the entire inverter 101 is covered with a mold; terminals connecting to the cable 104 and the cable 108 are extended to outside the mold; and the EBG-structure bus bar 107 is installed in the interior covered with the mold on the side of the terminal connecting to the cable 104.

With respect to the configuration illustrated in FIG. 1, a description has been given to a structure in which one EBG-structure bus bar 107 is provided on the power supply 103 side of the inverter 101 but the present invention is not limited to this. Like the EBG-structure bus bars 407 illustrated in FIG. 4, an inverter 401 may be provided with multiple bus bars. In the example illustrated in FIG. 4, an EBG-structure bus bar is additionally provided between a smoothing capacitor 405 and a semiconductor device 402 and between the semiconductor device 402 and a load 406 as well as between the power supply 403 side of the inverter 401 and a cable 404.

Figure 4:
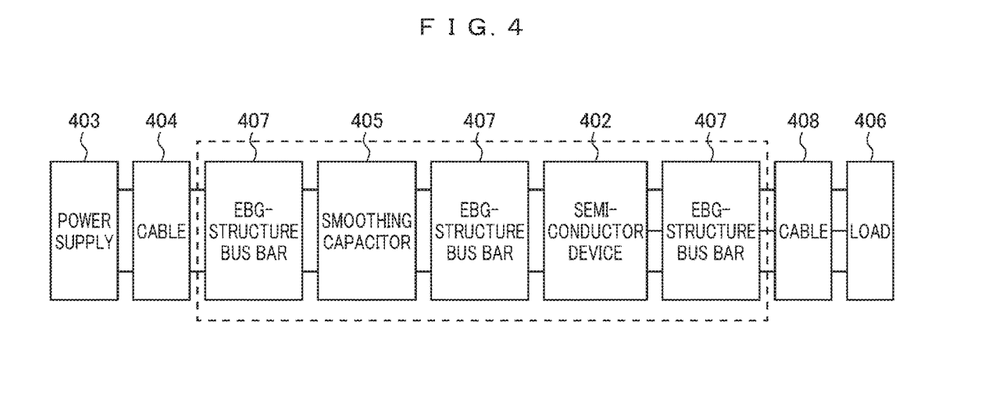
FIG. 4 is a block diagram illustrating a configuration of a power conversion apparatus in a modification to the first example of the present invention.

When the EBG-structure bus bar 407 is provided between the smoothing capacitor 405 and the semiconductor device 402 as illustrated in FIG. 4, noise of a specific frequency generated by switching the semiconductor device 402 can be removed.

When the EBG-structure bus bar 407 is provided between the semiconductor device 402 and the load 406 as illustrated in FIG. 4, noise of a specific frequency can be prevented from leaking into the cable 408 between the bus bar and the load 406 generated by the switching of the semiconductor device 402.

Example 2

Figure 5A:
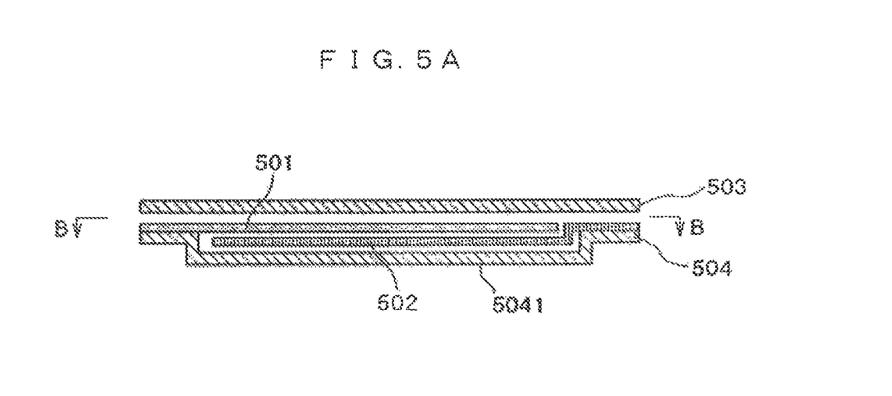
FIG. 5A is a front view of an EBG-structure bus bar implementing reduced inductance in a second example of the present invention.
Figure 5B:
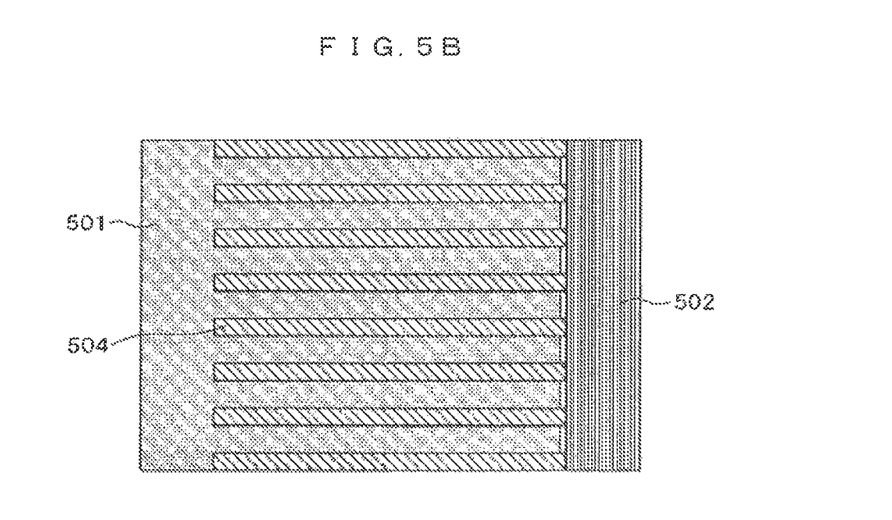
FIG. 5B is a view B-B of an EBG-structure bus bar implementing reduced inductance in the second example of the present invention.

FIG. 5A and FIG. 5B illustrate an example of an EBG-structure bus bar for noise propagation suppression having a function of implementing inductance reduction in a second example of the present invention. That is, this example provides a structure in which a noise propagation suppression element is provided and further inductance between a positive pole and a negative pole is reduced.

As explained in the first example, in the configuration illustrated in FIG. 1, since a high-frequency current flows between the switching semiconductor device 102 and the smoothing capacitor 105, it is important to reduce the inductance. This inductance can be reduced by reducing the gap between a positive plate 503 and a negative plate 504 as illustrated in FIG. 5A. For this reason, the following structure can be taken: one (noise propagation suppression element 501) of the noise propagation suppression elements is formed of a straight flat plate without bending; the other (noise suppression element 502) of the elements is formed as an element formed into an L shape; and the portion formed into an L shape is housed in a concave portion 5041 provided on the negative plate 504 side. Thus the noise propagation suppression elements 501 and 502 can be provided between the positive plate 503 and the negative plate 504 without changing the gap distance between the positive plate 503 and the negative plate 504. According to this example, a power conversion apparatus in which noise propagation suppression and inductance reduction are achieved in addition to the effect described in the first example can be provided.

Example 3

Figure 6A:
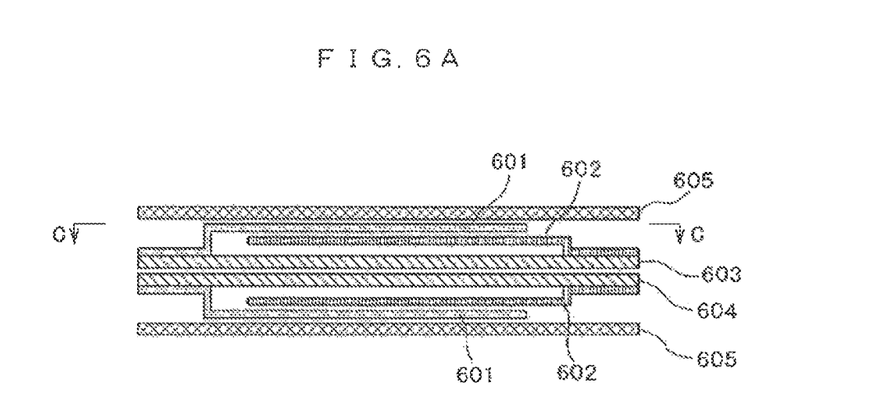
FIG. 6A is a front view of an EBG-structure bus bar reducing common mode noise in a third example of the present invention.
Figure 6B:
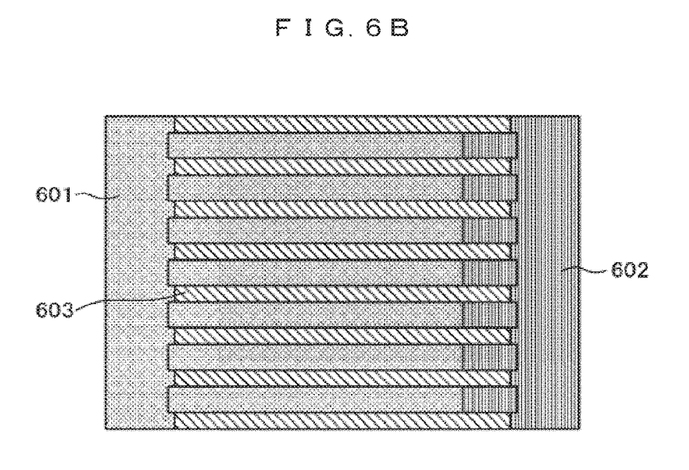
FIG. 6B is a view C-C of an EBG-structure bus bar reducing common mode noise in the third example of the present invention.

FIG. 6A and FIG. 6B illustrate an example of an EBG-structure bus bar for noise propagation suppression having a function of suppressing common mode noise in a third example of the present invention. Noise produced between the positive plate 203 and the negative plate 204 in the configuration illustrated in FIG. 2A or between the positive plate 503 and the negative plate 504 in the configuration illustrated in FIG. 5A is referred to as normal mode noise. In the normal mode noise, on the basis of ground (GND) potential, the respective noise voltages of the positive plate 203 or 503 and the negative plate 204 or 504 are inverted in polarity (in opposite phases). The noise propagation suppression elements 201, 202 and 501, 502 described in the first and second examples are so structured as to suppress this normal mode noise.

In general, a ground (GND) electrode (terminal) of a power conversion apparatus is connected to the housing of the apparatus using a braided wire or the like and the housing of the apparatus is brought to the GND potential. In this configuration, the positive plate 203 and the negative plate 204 fluctuate in an identical phase with respect to the GND potential. Noise with which a positive pole and a negative pole fluctuate in the same phase with respect to the GND potential is referred to as common mode noise in comparison with normal mode noise. It is also indispensable to reduce common mode noise as well as normal mode noise.

In the configuration illustrated in FIG. 6A and FIG. 6B, common mode noise with which the noise of the positive plate 603 and the negative plate 604 fluctuate in the same phase with respect to a GND plate 501 at GND potential is generated. Normal mode noise is propagated between the positive pole and the negative pole; therefore, the noise propagation suppression elements 201, 202 or 501, 502 are provided between the positive plate 203 and the negative plate 204 or between the positive plate 503 and the negative plate 504 as described in the first example and the second example. Meanwhile, in the configuration illustrated in FIG. 6A and FIG. 6B, common mode noise is propagated between a positive plate 603 or a negative plate 604 and a GND plate 605, that is, the housing of the apparatus. To cope with this, it is required to provide noise suppression elements 601 and 602 between the positive plate 603 or the negative plate 604 and the GND plate 605. For this reason, as illustrated in FIG. 6A, the GND plate 605 is provided in proximity to each of the positive plate 603 and the negative plate 604; and further, the noise propagation suppression elements 601 and 602 are provided either or both of between the positive plate 603 and the GND plate 605 and between the negative plate 604 and the GND plate 605. According to this example, a power conversion apparatus in which common mode noise propagated between the positive plate 603 or the negative plate 604 and the GND plate 605 is suppressed can be provided.

Example 4

Figure 7A:
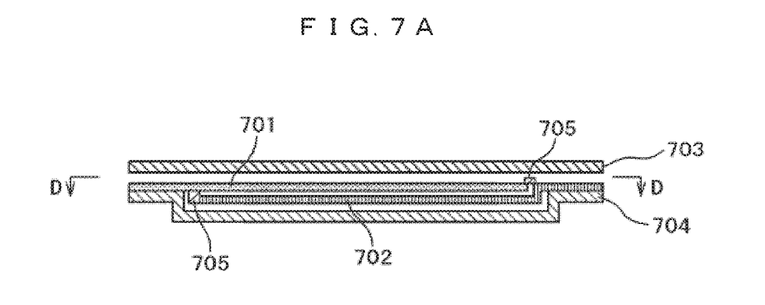
FIG. 7A is a front view of an EBG-structure bus bar mounted with a circuit component in a fourth example of the present invention.
Figure 7B:
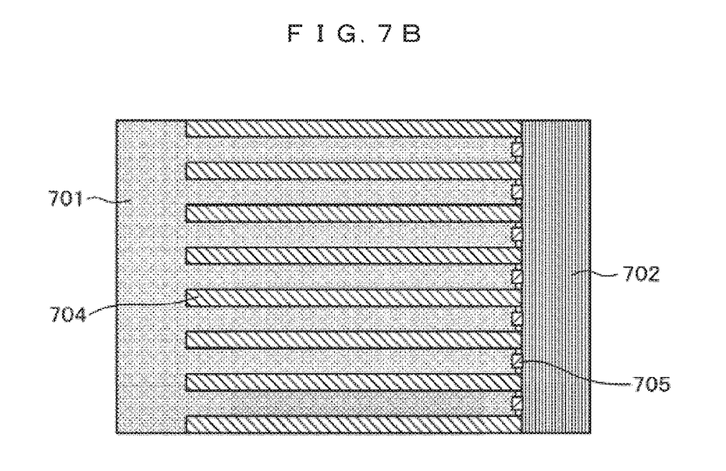
FIG. 7B is a view D-D of an EBG-structure bus bar mounted with a circuit component in the fourth example of the present invention.

FIG. 7A and FIG. 7B illustrate a configuration of a noise suppression element using a circuit component in a fourth example of the present invention. As mentioned above, noise propagation suppression elements suppress propagation of noise by being resonated by parasitic capacitance and inductance between individual opposed conductors; therefore, the size of the elements is increased with reduction in frequency. Consequently, as illustrated in FIG. 7A, it is configured to reduce the resonance frequency or match it with a desired frequency without increasing the size of the noise propagation suppression element. That is, a circuit component 705 such as a capacitor or an inductor is mounted such that the circuit component is connected to noise propagation suppression elements 701 and 702. In addition, a value of the capacitor or inductor as the circuit component 705 is selected such that the resonance frequency is matched with a frequency at which noise is desired to be suppressed. Thus a noise propagation suppression effect is obtained at the desired frequency without changing the size of the noise propagation suppression element 701 or 702.

The section of 'Technical Problem' describes a problem that use of a filter circuit element for noise propagation suppression incurs increase in the volume of the apparatus. This problem is encountered when a filter circuit element in the prior art is provided in an area between a positive plate and a negative plate, between a positive plate and GND or between a negative plate and GND where a high voltage of several tens to several hundreds of V or above is applied. As a result, enhancement of breakdown voltage leads to increase in size. Meanwhile, in the structure described in relation to this example, a circuit component for resonance frequency adjustment is mounted between noise suppression elements at the same potential. For this reason, the breakdown voltage may be as low as several V to several tens of V or below and thus the component size is not increased.

According to this example, a power conversion apparatus in which noise propagation suppression can be implemented at a desired frequency without increasing the occupied volume within the apparatus or limitation on the frequency of noise can be provided.

Example 5

Figure 8A:
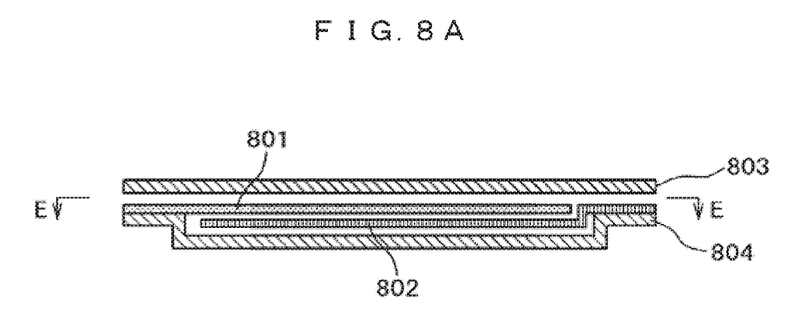
FIG. 8A is a front view of an EBG-structure bus bar implementing band widening in a fifth example of the present invention.
Figure 8B:
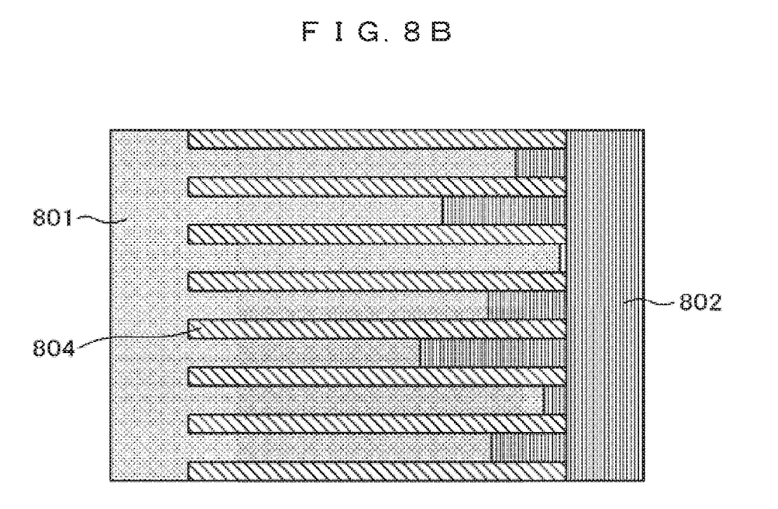
FIG. 8B is a view E-E of an EBG-structure bus bar implementing band widening in the fifth example of the present invention.

As illustrated in FIG. 8A and FIG. 8B, a noise suppression effect can be obtained over a wider band by taking the following measure: noise propagation suppression elements 801 and 802 are shaped such that the size of individual elements (length of comb teeth) is varied (made non-uniform) to cope with multiple resonance frequencies.

The shape of all the noise propagation suppression elements 801 and 802 is straight or an L-shaped comb shape. Instead of that, part or whole of the bus bar may be in a meander shape or a spiral shape for higher inductance.

In the above-mentioned example, parasitic capacitance is determined by the facing area between the noise propagation suppression elements 801 and 802. A higher parasitic capacitance value can be obtained with a smaller area by placing a dielectric material between the noise propagation suppression elements 801 and 802.

With respect to the configurations described in each of the examples, an EBG-structure bus bar is fabricated by cutting and bending a metal plate. Instead of that, a printed board process may be adopted to make a bus bar. Use of a printed board process makes it possible to easily fabricate a multi-layer structure and accurately control an amount of a gap between a positive plate and a negative plate. In the fourth example, a via (hole) may be formed in the positive plate 703 and the negative plate 704 in a position above an area where the circuit component 705 is mounted. Thus mounting the circuit component 705 on the noise propagation suppression elements 701 and 702 is facilitated.

In the above description of configurations, cases where the power conversion apparatus is an inverter are taken as examples. The present invention is also applicable to a case where the power conversion apparatus is a converter. In case of a converter, a rectifying circuit and a switching circuit for step-up or step-down is used. By providing a bus bar as described above to which these circuits are connected with a noise suppression structure, a low-noise power conversion apparatus can be provided.

According to the structure described in relation to this example, a power conversion apparatus with reduced electromagnetic noise can be provided.

The present invention is not limited to the above-mentioned examples and includes various modifications. The above examples have been described in detail for making the present invention easily understandable and need not include all the configuration elements described above. A part of the configuration elements of an example may be replaced with a configuration element of another example; and a configuration element of an example may be added to the configuration elements of another example. A different configuration element may be added to or replaced with a part of the configuration elements of each example and a part of the configuration elements of each example may be deleted.

REFERENCE SIGNS LIST

- 101 . . . Power conversion apparatus,
- 102 . . . Semiconductor device,
- 103 . . . power supply,
- 104, 108 . . . Cable,
- 105 . . . Smoothing capacitor,
- 106 . . . Load,
- 107 . . . EBG-structure bus bar,
- 201, 202, 501, 502, 601, 602, 701, 702, 801, 802 . . . Noise propagation suppression element,
- 203, 503, 603, 703, 803, 903 . . . Positive plate,
- 204, 504, 604, 704, 804, 904 . . . Negative plate,
- 605 . . . GND plate,
- 705 . . . Circuit component.

The invention claimed is:

1. A power conversion apparatus comprising:
a bus bar connecting a cable connected to an external power supply or load and an internal circuit,
wherein the bus bar is provided with an electromagnetic band gap structure and electromagnetic noise is thereby suppressed from propagating from the power conversion apparatus to the power supply or load via the cable, and
wherein the bus bar is configured such that a positive plate and a negative plate are disposed in parallel to each other and the electromagnetic band gap structure is formed by disposing between the positive plate and the negative plate a pair of conductive plates one ends of which are connected to either the positive plate or the negative plate and the other ends of which are molded into a comb teeth shape such that the portions molded into a comb teeth shape are opposed to each other with a gap left in between.

2. The power conversion apparatus according to claim 1, wherein the tips of the portions molded into a comb teeth shape of the pair of the conductive plates are connected with the other conductive plate with a capacitor or an inductor in between.

3. The power conversion apparatus according to claim 1, wherein the comb teeth formed into a comb teeth shape of the pair of the conductive plates the other ends of which are formed into a comb teeth shape are non-uniform in length or width.

4. The power conversion apparatus according to claim 1, wherein the power conversion apparatus is an inverter.

5. The power conversion apparatus according to claim 4, wherein a bus bar provided with an electromagnetic band gap structure is provided between a cable connecting to a power supply external to the inverter and a smoothing capacitor of the inverter.

6. The power conversion apparatus according to claim 1, wherein the power conversion apparatus is a converter.

7. The power conversion apparatus according to claim 1, wherein the bus bar is configured such that a positive plate and a negative plate are disposed in parallel to each other and the electromagnetic band gap structure is formed by disposing two conductive plates between the positive plate and the negative plate such that the two conductive plates are not in contact with each other and partly in parallel to each other and respectively connecting portions of the two conductive plates other than the portions disposed in parallel to each other to either the positive plate or the negative plate.

8. A power conversion apparatus comprising:
a bus bar connecting a cable connected to an external power supply or load and an internal circuit,
wherein the bus is provided with an electromagnetic band gap structure and electromagnetic noise is thereby suppressed from propagating from the power conversion apparatus to the power supply or load via the cable, and
wherein the bus bar is configured such that a positive plate and a negative plate are disposed in parallel to each other and are sandwiched between a pair of ground electrode plates from both sides thereof and the electromagnetic band gap structure is formed by placing between the positive plate and one of the pair of the ground electrode plates a pair of conductive plates one ends of which are connected with the positive plate and the other ends of which are molded into a comb teeth shape such that the portions molded into a comb teeth shape are opposed to each other with a gap left in between and placing between the negative plate and the other of the pair of the ground electrode plates a pair of conductive plates one ends of which are connected with the negative plate and the other ends of which are molded into a comb teeth shape such that the portions molded into a comb teeth shape are opposed to each other with a gap left in between.

9. The power conversion apparatus according to claim 8, wherein the bus bar is configured such that a positive plate and a negative plate are disposed in parallel to each other and the electromagnetic band gap structure is formed by disposing two conductive plates between the positive plate and the negative plate such that the two conductive plates are not in contact with each other and are partly in parallel to each other and respectively connecting portions of the two conductive plates other than the portions disposed in parallel to each other to either the positive plate or the negative plate.

10. The power conversion apparatus according to claim 8, wherein the power conversion apparatus is an inverter.

11. The power conversion apparatus according to claim 10, wherein a bus bar provided with an electromagnetic band gap structure is provided between a cable connecting to a power supply external to the inverter and a smoothing capacitor of the inverter.

12. The power conversion apparatus according to claim 8, wherein the power conversion apparatus is a converter.

13. A power conversion apparatus in which a cable connected to an external power supply or load an internal circuit are connected through a bus bar configured such that a positive plate and a negative plate are disposed in parallel to each other, wherein between the positive plate and the negative plate constituting the bus bar, a pair of conductive plates connected to either the positive plate or the negative plate are disposed such that portions of the pair of the conductive plates are in parallel to each other and not in contact with each other, wherein the portions of the pair of the conductive plates disposed in parallel to each other and not in contact with each other are respectively molded into a comb teeth shape and are disposed such that the portions molded into a comb teeth shape are opposed to each other with a gap left in between, and wherein the comb teeth of the comb teeth shape of the pair of the conductive plates are non-uniform in length or width.

14. The power conversion apparatus according to claim 13, wherein the tips of the portions molded into a comb teeth shape of the pair of the conductive plates are connected with the other conductive plate with a capacitor or an inductor in between.

15. A power conversion apparatus comprising:

a bus bar connecting a cable connected to an external power supply or load and an internal circuit, wherein the bus bar is provided with an electromagnetic band gap structure and electromagnetic noise is thereby suppressed from propagating from the power conversion apparatus to the power supply or load via the cable, and wherein the bus bar is configured such that a positive plate and a negative plate are disposed in parallel to each other and the electromagnetic band gap structure is formed by disposing two conductive plates between the positive plate and the negative plate such that the two conductive plates are not in contact with each other and partly in parallel to each other and respectively connecting portions of the two conductive plates other than the portions disposed in parallel to each other to either the positive plate or the negative plate.

* * * * *